(12) United States Patent  
Lin (10) Patent No.: US 6,437,987 B1
(45) Date of Patent: Aug. 20, 2002

(54) UNIVERSAL RETAINING MECHANISM AND HOLDER THEREOF

(75) Inventor: Chien Chung Lin, Taoyuan (TW)

(73) Assignee: Berg Technology, Inc., Reno, NV (US)

(*) Notice: Subject to any disclaimer, the term of this patent is extended or adjusted under 35 U.S.C. 154(b) by 0 days.

(21) Appl. No.: 09/521,532

(22) Filed: Mar. 8, 2000

(30) Foreign Application Priority Data

Mar. 10, 1999 (SG) .............................................. 9901096

(51) Int. Cl.$^7$ ................................................ H05K 7/11
(52) U.S. Cl. ........................ 361/756; 361/759; 29/832
(58) Field of Search .............................. 361/728–732, 361/736, 737, 740, 741, 747, 748, 756, 759–761, 807, 810

(56) References Cited

U.S. PATENT DOCUMENTS 6,038,131 A * 3/2000 Valosen et al. ............. 361/756

* cited by examiner

*Primary Examiner*—Darren Schuberg
*Assistant Examiner*—Yean-Hsi Chang (57) ABSTRACT

Disclosed is a universal retaining mechanism (URM) comprising a pair of holders that may be secured to a mainboard and for holding a CPU module in-between the holders, wherein each holder includes: a base member for securing the holder to the mainboard; a holding member rotatably connected to the base member and having a main wall; at least a latch integrally formed with the holding member and arranged on a side of the main wall for latching the CPU module from front and rear sides of the CPU module; positioning means formed on the main wall for locking to the CPU module; and a flexible rib integrally formed with the holding member on the main wall and for cooperating with the latch to guide the CPU module upon insertion of the CPU module.

22 Claims, 8 Drawing Sheets

UNIVERSAL RETAINING MECHANISM AND HOLDER THEREOF

FIELD OF INVENTION

This invention relates to a retaining mechanism, particularly to a universal retaining mechanism (URM) for holding a Central Processing Unit (CPU) module, where the URM may be adapted to either a CPU module of SECC I, SECC II, or SEPP type, which provides expanded maneuvering room while inserting and/or releasing the CPU module into or from the URM, and facilitates on-line installation and maintenance operations.

BACKGROUND OF INVENTION

A CPU module, that is an indispensable component for any computer equipment, is usually connected to a computer mainboard by means of a set of retaining mechanism that is secured to the mainboard. Due to continuous research and development of CPU modules, commercially available CPU modules are now categorized into SECC I type, SECC II type, and SEPP type. It is known to computer manufactures that, a CPU module of SECC I type is secured to its corresponding retaining mechanism by means of locking means provided on opposing upper sides of the CPU module; a CPU module of SECC II or SEPP type is secured to its corresponding retaining mechanism by means of locking surfaces formed on a heat dissipating fin of the CPU module. Due to various locking structures of various types of CPU modules, computer manufactures will need to use a variety of retaining mechanisms to accommodate various CPU modules, thereby increasing their stocking cost.

To solve the above problems, CPU manufactures stipulate standards of universal retaining mechanisms (URMs) which require the retaining mechanisms to be adapted to either a CPU module of SECC I, SECC II, or SEPP type.

However, commercially available URMs are usually oversized, can hardly be folded and stacked, and thus require more packing materials and shipping space Furthermore, commercially available URMs usually require a user to assemble a CPU module from opposing outer sides of the retaining mechanism so as to latch) on the locking surfaces of the CPU module. However, in order to save space and to reduce cost, a mainboard layout is commonly designed such that most computer components abut on each other; it is thus very common to arrange other computer components at outer sides of the retaining mechanism. Such mainboard layout thus causes difficulty for assembling the CPU module to the retaining mechanism from opposing outer sides of the retaining mechanism and further reduces maneuvering room while inserting and/or releasing the CPU module.

SUMMARY OF INVENTION

Disclosed is a universal retaining mechanism (URM) comprising a pair of holders that may be secured to a mainboard and for holding a CPU module in-between the holders, wherein each holder includes: a base member for securing the holder to the mainboard; a holding member rotatably connected to the base member and having a main wall: at least a latch integrally formed with the holding member and arranged on a side of the main wall for latching the CPU module from front and rear sides of the CPU module; positioning means formed on the main wall for locking to the CPU module; and a flexible rib integrally formed with the holding member on the main wall and for cooperating with the latch to guide the CPU module upon insertion of the CPU module.

According to the structure disclosed by this invention, it is a primary object of this invention to provide a universal retaining mechanism having a foldable construction and a folded height of a mere 25 mm so as to save packing material and reduce shipping space.

It is a further object of this invention to provide a universal retaining mechanism that latches or releases locking surfaces of a CPU module from front and rear sides of the CPU module so as to provide expanded maneuvering room while inserting and/or releasing the CPU module, and to facilitate on-line installation and maintenance operations.

The characterized features and other advantages of this invention may be realized from the accompanying explanations, drawings and claims.

DESCRIPTIONS OF PREFERRED EMBODIMENTS

Figure 1:
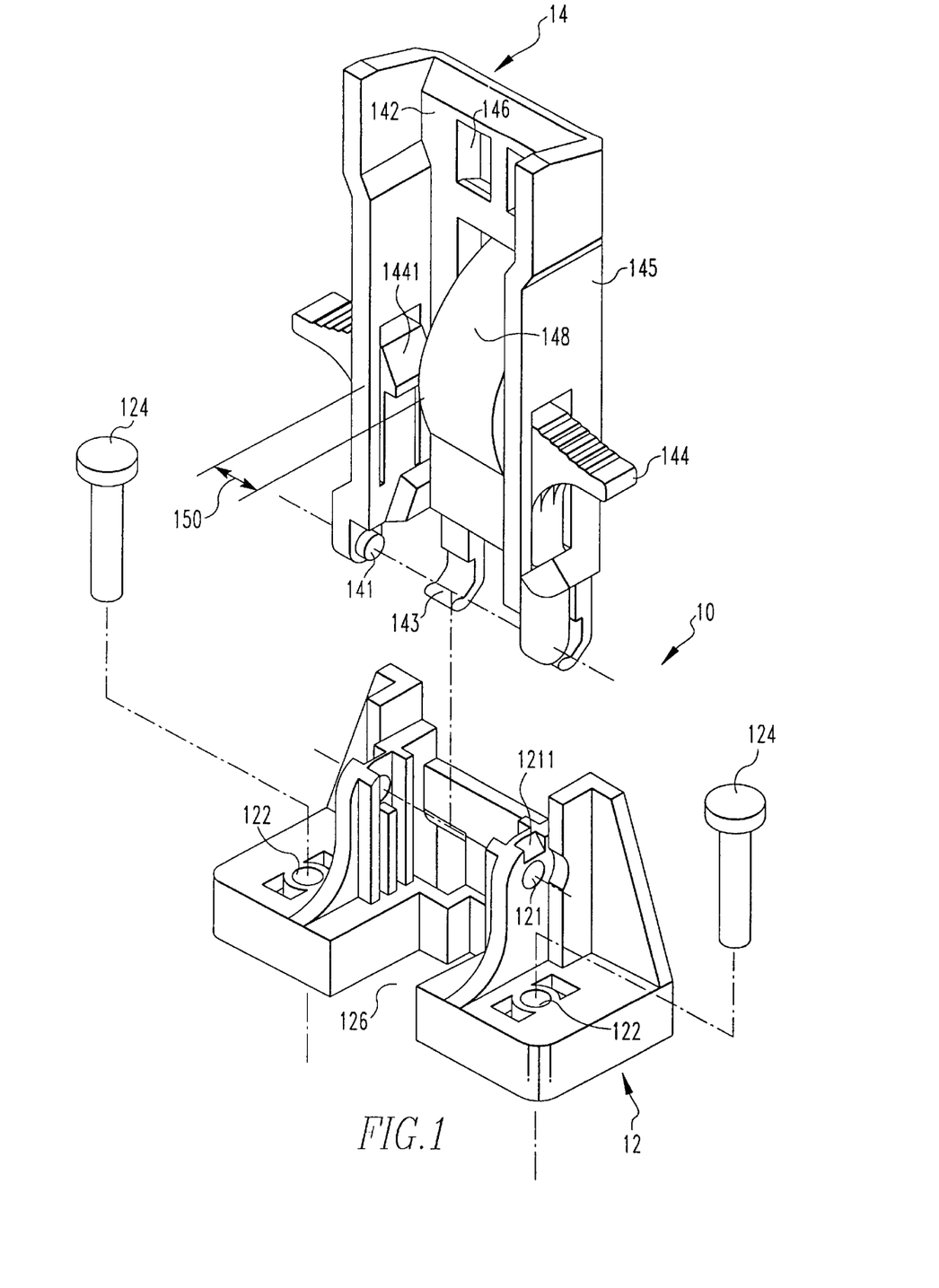
FIG. 1 is an exploded, perspective view of one of the holders of a universal retaining mechanism according to this invention, illustrating an inner side of the holder for holding a CPU module.
Figure 2:
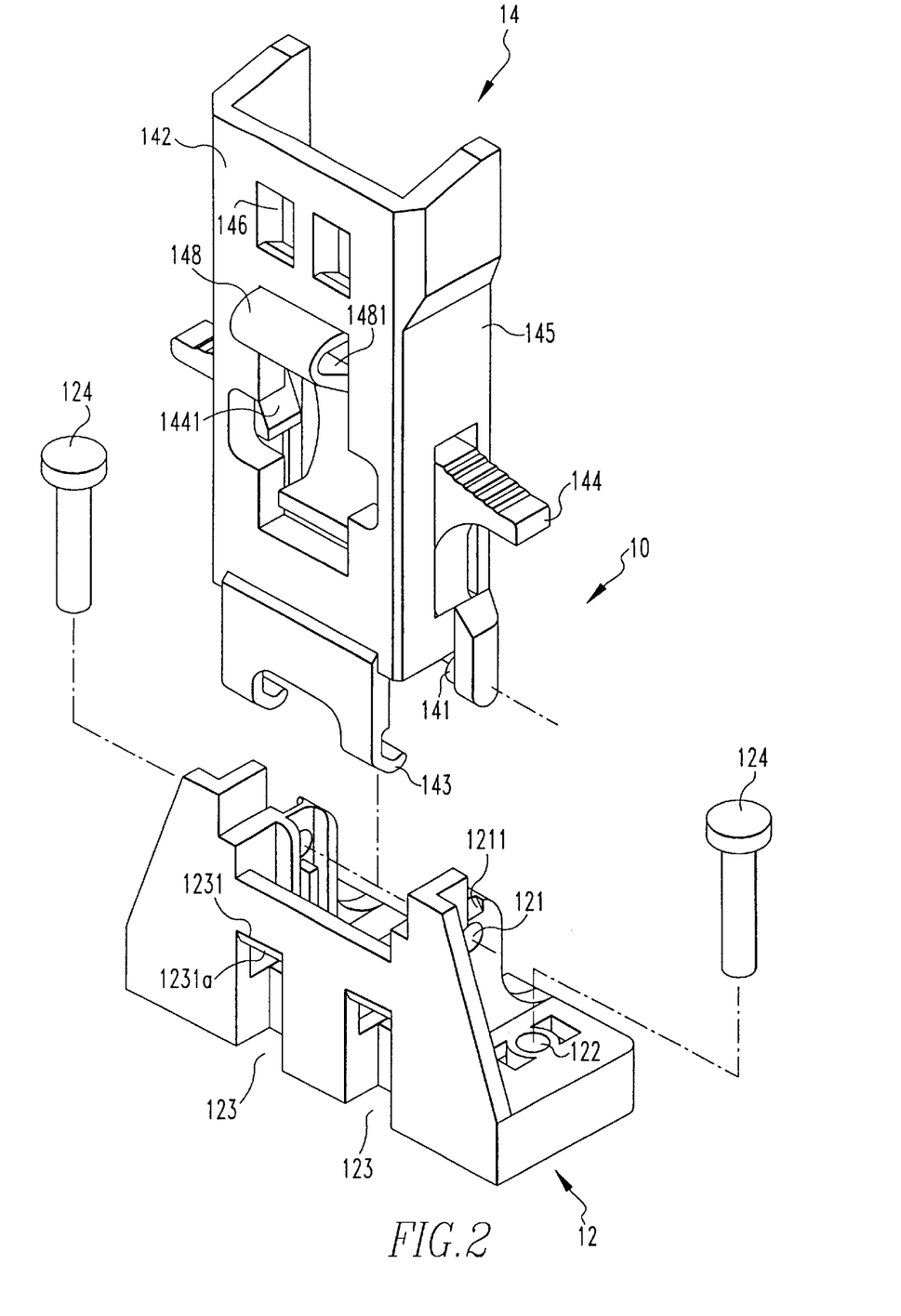
FIG. 2 is a further exploded, perspective view of the holder of FIG. 1, illustrating an outer side of the holder.

FIGS. 1 and 2, respectively, illustrate the perspective views of the inner and outer sides of holders 10 of a universal retaining mechanism according to this invention, The "inner side" as referred in this specification directs to a side of the holder 10 or retaining mechanism that contacts an object to be Inserted, and the "outer side" as referred in this specification directs to a side of the holder 10 or retaining mechanism that does not contact the object to be inserted. FIG. 2 illustrates the outer side of the holder 10 that cannot be observed from the perspective view of FIG. 1.

Figure 3:
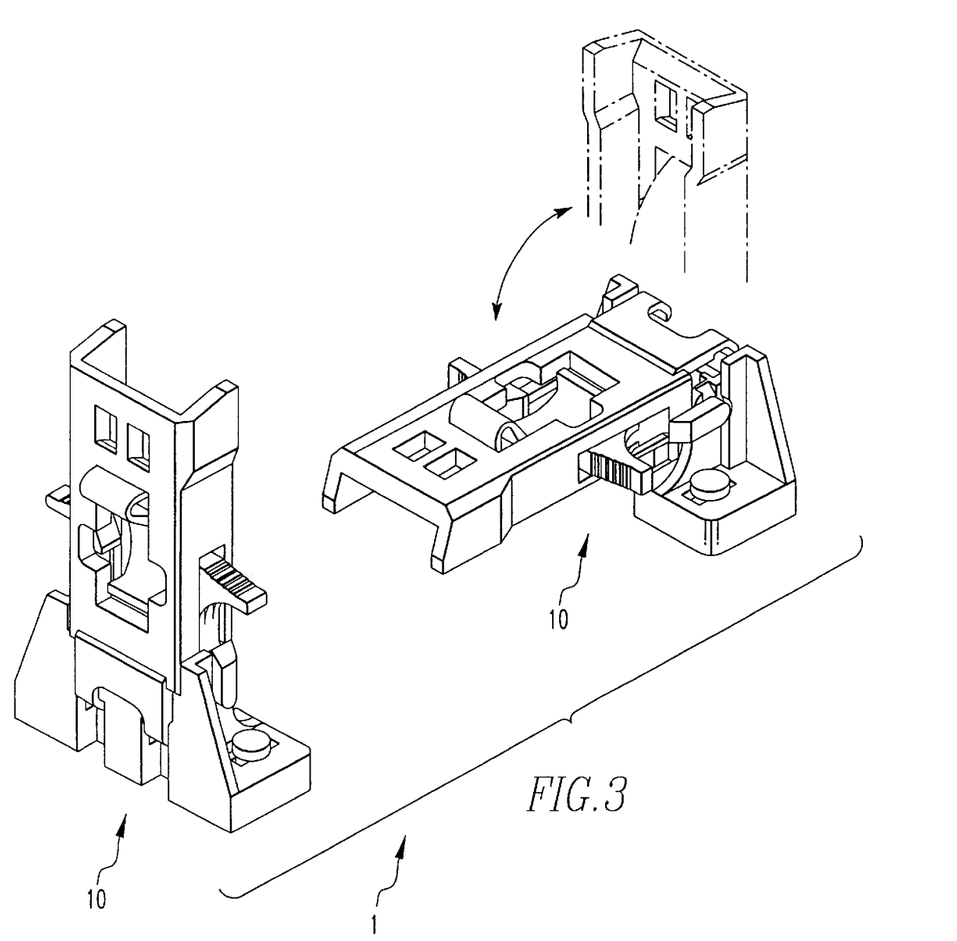
FIG. 3 is a perspective view of a universal retaining mechanism of this invention, wherein the holder located on the right hand side of FIG. 3 illustrates the folded state of the holder.

As shown in FIG. 3, the universal retaining mechanism 1 of this invention comprises a pair of holders 10 that are spaced from each other and secured to a mainboard (not shown). Since a set of retaining mechanisms 1 includes a pair of holders 10 that are secured to the mainboard facing each other, to reduce mold cost, the pair of holders 10 may both be designed to have a symmetrical construction, such as that illustrated in the embodiment of FIGS. 1 and 2. One may also use different molds to form a pair of holders having mirror constructions 80 as to reduce raw material.

The following is directed to detailed descriptions with respect to a pair of holders 10 having a symmetrical construction; persons skilled in the art may certainly implement the features as described to design a pair of holders having mirror constructions.

With reference to FIGS. 1 and 2, each holder 10 includes: a base member 12 for securing the holders 10 to the mainboard; and a holding member 14 rotatably connected to the base member 12 and having a main wall 142. The holding member 14 includes a pair of latches 144 integrally formed with the holding member 14 and arranged on opposing sides of the main wall 142, opposing inner sides of the latches 144 are each formed at a top edge with a hook 1441; locking means 146 formed on the main wall 142 of the holding member 14; and a flexible rib 148 formed with the holding member 14 on the main wall 142 and being distant from the latches 144 for a fixed gap.

The holding member 14 may be further formed with a pair of side walls 145 extending from opposing sides of the main wall 142 neighboring the latches 144, extending towards inner sides of the holder 10 in a direction that is substantially normal to the main wall 142, and being distant from the flexible rib 148 to form guide grooves 150 having a fixed gap.

The positioning means 146 is, in general, a square aperture to accommodate locking means provided on conventional CPU modules of SECC I type.

The flexible rib 148 is preferred to have a resilient pivot 1481 that is located at an outer side of the main wall 142 and provides functions that will be described later.

As shown in FIGS. 1 and 2, the base member 12 of the holder 10 may be formed with a pair of penetrating bores 122 that accommodate a pair of openings (not shown) provided on the mainboard; the holder 10 may be secured to the mainboard by passing a pair of pins 124 through the bores 122 and the openings provided on the mainboard. Other conventional fastening means, such as heat-fusion adhesive, conventional adhesive, bolts, and tight fitting may also be implemented to secure the holder 10 to the mainboard.

The base member 12 may be formed with a pair of pivotal openings 121 for receiving rotary shafts 141 formed at a bottom of the holding member 14 such that the holding member 14 is rotatable with respect to the base member 12. The pivotal opening 121 may further be formed with an inclined face 1211 at an upper end to allow easy insertion of the rotary shafts 141 into the pivotal opening 121. In FIG. 3, the holder 14 located on the right hand side illustrates the folded state of the holder 14 and the phantom lines illustrate the expanded (upright) state of the holder 14. The overall height of the holder 10 shown in FIG. 3, after folding, may be as low as 25 mm, or even lower.

With reference to FIG. 1, the base member 12 may be further formed with an indent 126 at a bottom thereof for receiving a corresponding slot connector (FIGS. 4–7).

Referring to FIG. 2, the base member 12 may further be formed with at least a recess 123 at an outer bottom thereof. The recess 123 includes a top edge 1231 that cooperates with a finger 143 formed at an outer bottom of the holding member 14 such that when the holding member 14 is rotated from its folded state to its expanded state, the finger 143 clamps on the top edge 1231 of the recess 123. It is preferred that a "click" sound is made due to the friction between the finger 143 and the top edge 1231 so as to allow the user to assure that the holding member 14 reaches its fully expanded state. The top edge 1231 may be further formed with an inclined face 1231a to allow easy clamping of the finger 143 onto the top edge 1231.

Figure 4:
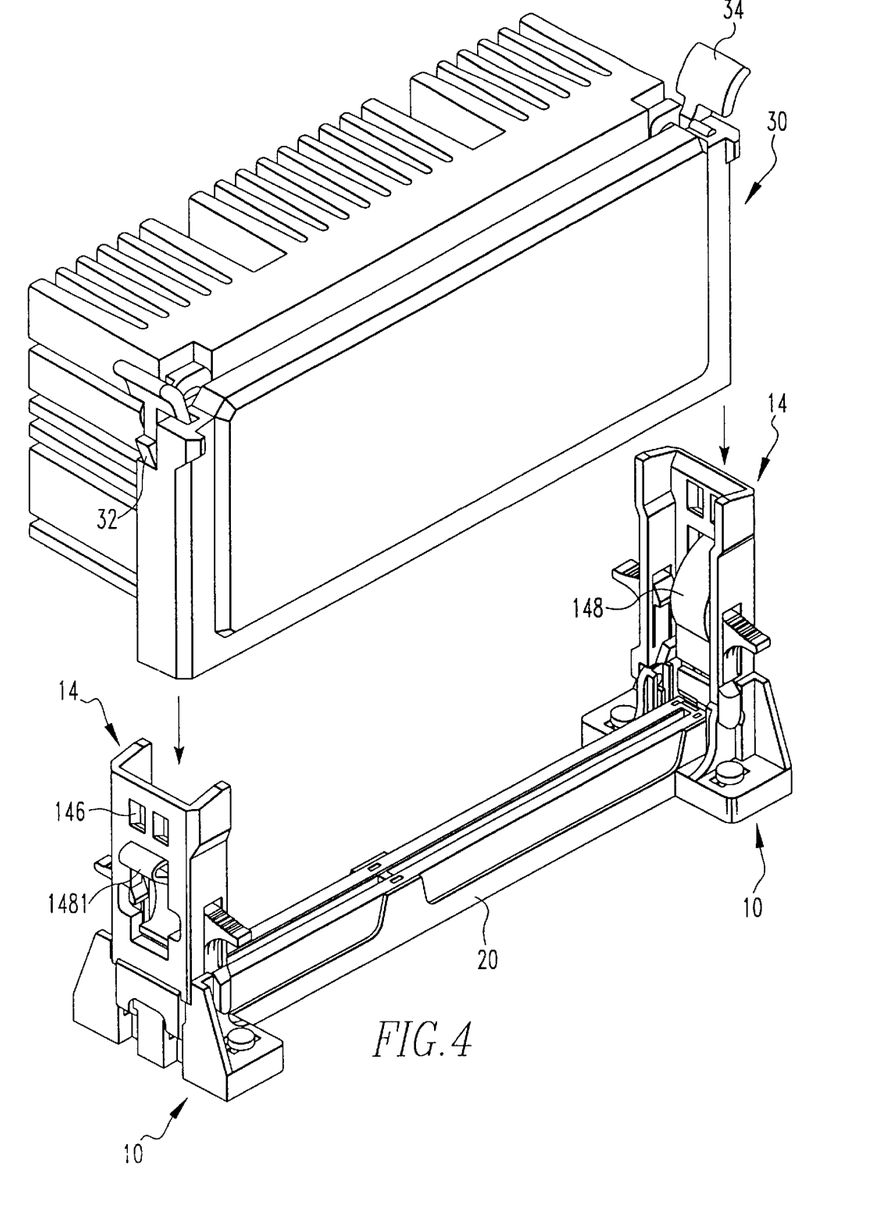
FIG. 4 is a perspective view of the universal retaining mechanism of FIG. 3 before insertion of a CPU module of SECC I type.
Figure 5:
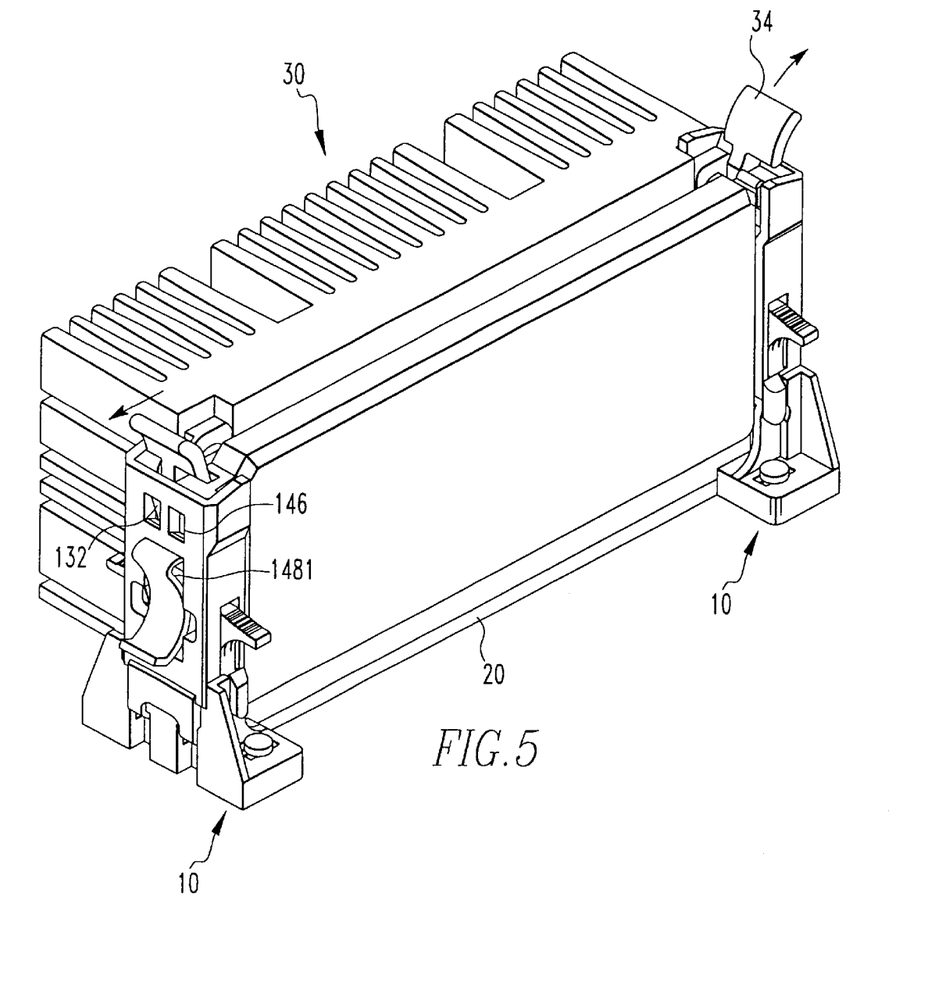
FIG. 5 is a perspective view of the universal retaining mechanism of FIG. 3 after insertion of a CPU module of SECC I type.

FIGS. 4 and 5 are perspective views of the universal retaining mechanism of FIG. 3 before and after insertion of a CPU module 30 of SECC I type (referred to as "SECC I CPU" hereinafter). 9ECC I CPU 30 is provided with conventional locking means 32 on opposing upper sides thereof; a lever 34 is connected to the locking means 32 for operating the locking means 32.

As shown in FIGS. 4 and 5, the pair of the holders 10 of the retaining mechanism 1 are secured with a slot connector 20 that is adapted to the SECC I CPU 30 in-between the holders 10. To insert the SECC I CPU 30 inbetween the holders 10 of the retaining mechanism 1, the SECC I CPU 30 is first inserted towards the slot connector 20 along the holding member 14, that is, in a direction indicated by the arrow of FIG. 4 and thus comes into contact with the flexible ribs 148. Upon thrust of the SECC I CPU 30, the flexible ribs 148 then deform and move towards outer sides of the holder 10 about the resilient pivots 1481 due to their flexibility (see FIG. 5). After SECC I CPU 30 is inserted in place, the locking means 32 provided on its opposing upper sides clamps onto the positioning means 146 of the holder 14 to prevent unwanted movement of the SECC I CPU 30, as shown in FIG. 5, To release the SECC I CPU 30 from the retaining mechanism 1, the levers 34 connected to the locking means 32 are first pushed towards outer sides of the SECC I CPU 30, that is, in directions indicated by the arrows of FIG. 5 so as to separate the locking means 32 from the positioning means 146; the SECC I CPU 30 is then pulled towards a direction opposing the slot connector 20. After the SECC I CPU 30 is pulled to a certain height that no longer pushes the flexible ribs 148, the flexible ribs 148 move towards the inner sides of the holders 10 about the resilient pivots 1481 and return to their original configurations.

Figure 6:
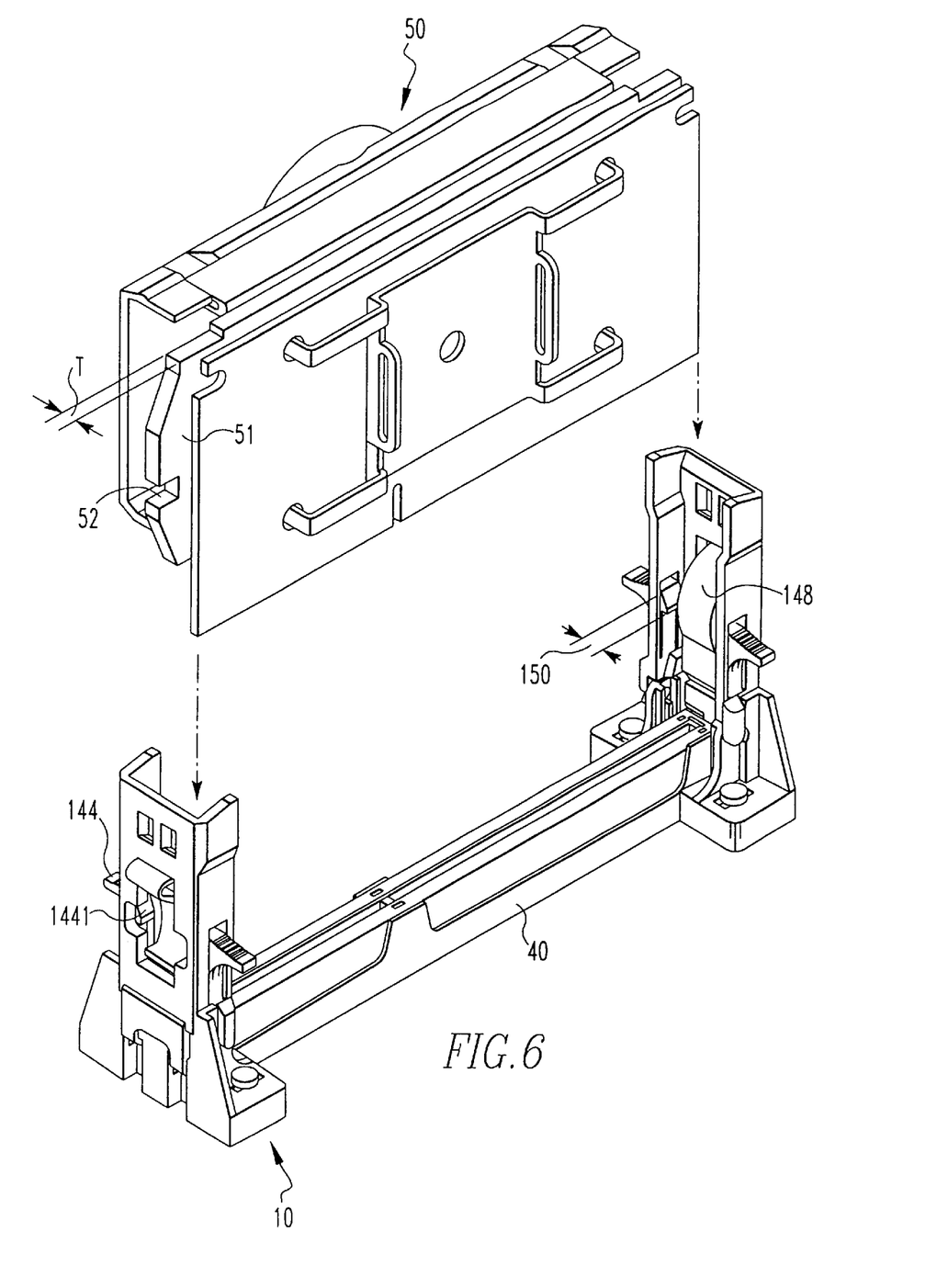
FIG. 6 is a perspective view of the universal retaining mechanism of FIG. 3 before insertion of a CPU module of SEPP type.
Figure 7:
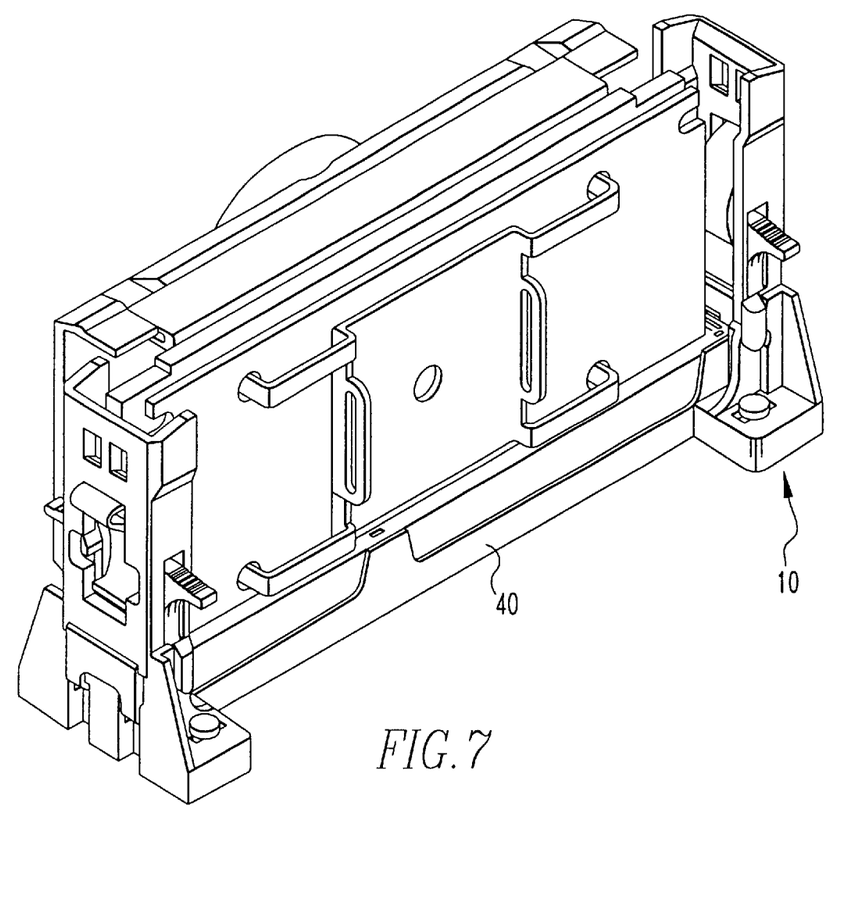
FIG. 7 is a perspective view of the universal retaining mechanism of FIG. 3 after insertion of a CPU module of SEPP type.

FIGS. 6 and 7 are perspective views of the universal retaining mechanism of FIG. 3 before and after insertion of a CPU module 50 of SEPP type (referred to as "SEPP CPU" hereinafter). SEPP CPU 50 is provided with conventional locking surfaces 52 formed on a heat dissipating fin 51 of the SEPP CPU 50. As shown in FIGS. 6 and 7, the pair of the holders 10 of the retaining mechanism 1 is secured with a slot connector 40 that is adapted to the SEPP CPU 50 in-between the holders 10. To insert the SEPP CPU 50 in-between the holders 10 of the retaining mechanism 1, the heat dissipating fin 51 of the SEPP CPU 50 is first inserted between the guide grooves 150 formed between the flexible ribs 148 and the latches 144 so as to be inserted towards the slot connector 40 along the holding members 14, that is, in a direction indicated by the arrow of FIG. 6. After SEPP CPU 50 is inserted in place, the hooks 1441 of the latches 144 then hook onto the locking surfaces 52 formed on the heat dissipating fin 51 so as to latch the SEPP CPU 50 from front and rear sides of the SEPP CPU 50 and to prevent unwanted movement of the SEPP CPU 50, as shown in FIG. 7.

To release the SEPP CPU 50 from the retaining mechanism 1, the latches 144 are first pushed towards the slot connector 40, that is, in a direction indicated by the arrow of FIG. 7 so as to separate the hooks 1441 of the latches 144 from the locking surfaces 52; the SEPP CPU 50 is then pulled towards a direction opposing the slot connector 40.

Figure 8:
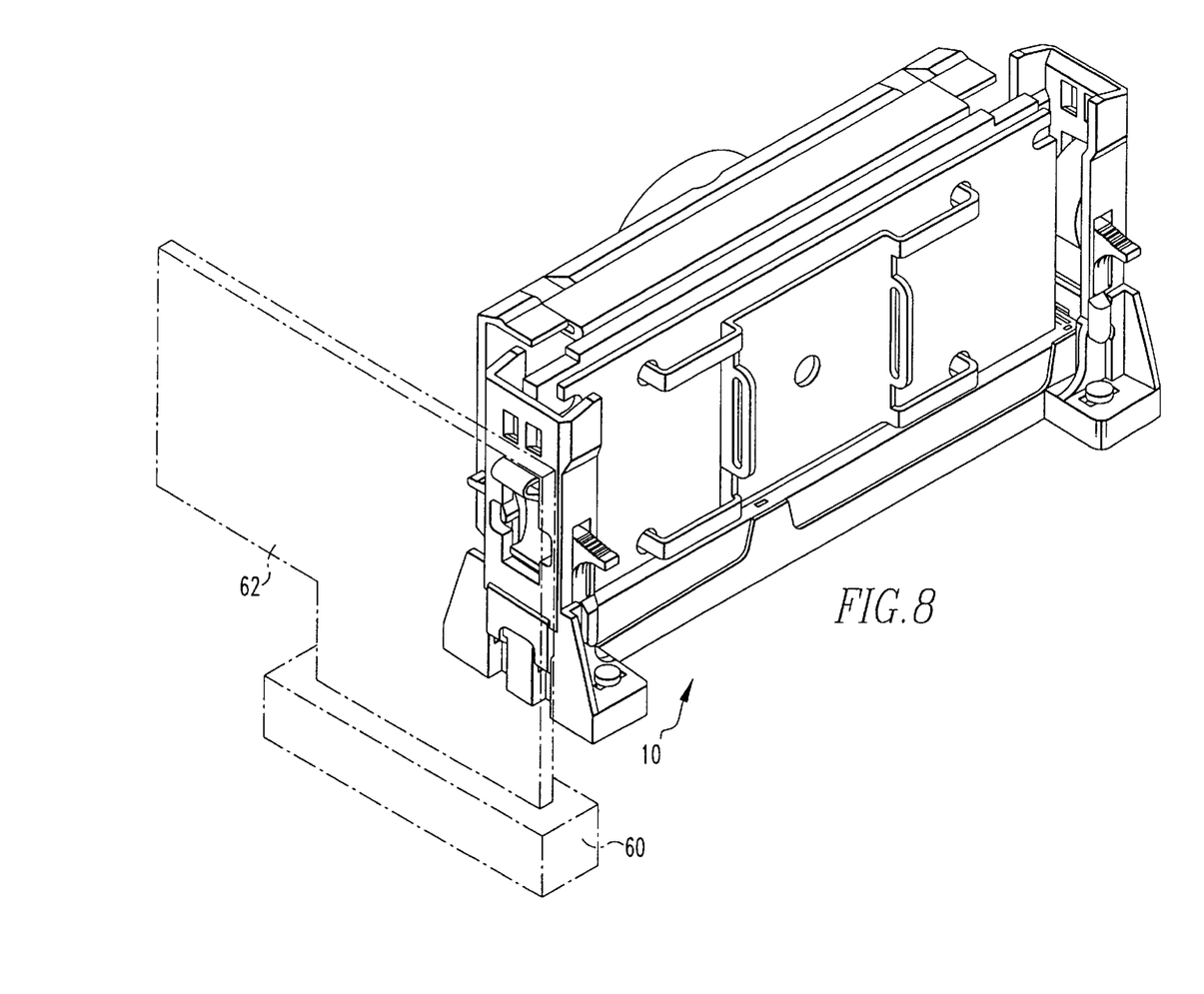
FIG. 8 illustrates the universal retaining mechanism of this invention abutting on a PCI connector into which is inserted a PCI card.

As shown in FIG. 8, even if the retaining mechanism 1 of the invention abuts on a PCI connector 60 and a PCI card 62 that is inserted in the PCI connector 60, because the latches 144 of holders 10 of the retaining mechanism 1 of this invention, that latch onto the locking surfaces 52 of the SEPP CPU 50, are operated and controlled from front and rear sides of the SEPP CPU 50, the PCI connector 60 and PCI card 62 being arranged to be abutting on the retaining mechanism 1 shall not cause difficulty in reducing maneuvering room, inserting and/or releasing the SEPP CPU 50.

Furthermore, the holders 10 of the retaining mechanism 1 of this invention are featured with a foldable construction and have a folded height of a mere 25 mm; this invention further helps to save packing material, reduce shipping space, and manufacturing and marketing cost.

The aforementioned explanations are directed to the description of several preferred embodiments according to the present invention. Various changes and implementations can be made by those skilled in the art without departing from the technical concept of the present invention. Since the present invention is not limited to the specific details described in connection with the preferred embodiments except those that may be within the scope of the appended claims, changes to certain features of the preferred embodiments without altering the overall basic function of the invention are contemplated.

What is claimed is:

1. A holder for connecting a central processing unit (CPU) module to a mainboard, the CPU module including a front side, a rear side, and two opposing sides, and being formed with locking means and/or locking surfaces, the holder comprising:
   a base member for securing the holder to the mainboard; and
   a holding member rotatably connected to the base member and having a main wall, wherein the holding member includes an inner side that contacts the CPU module to be inserted, and an outer side that does not contact the CPU module to be inserted; the holding member including:
   at least a latch integrally formed with the holding member and arranged on a side of the main wall for latching the locking surfaces of the CPU module from the front and rear sides of the CPU module;
   positioning means formed on the main wall for locking to the CPU module; and
   a flexible rib integrally formed with the holding member on the main wall and for cooperating with the latch to guide the CPU module upon insertion of the CPU module.

2. The holder as set forth in claim 1, wherein the holding member is further formed with at least a side wall extending from a side of the main wall neighboring the latch, extending towards the inner side of the holding member in a direction that is substantially normal to the main wall, and being distant from the flexible rib to form a guide groove having a fixed gap.

3. The holder as set forth in claim 1, wherein the flexible rib has a resilient pivot that is located at the outer side of the holding member.

4. The holder as set forth in claim 1, wherein the positioning means is a square aperture.

5. The holder as set forth in claim 1, wherein the base member of the holder is formed with a pair of penetrating bores that accommodate a pair of openings provided on the mainboard, so as to secure the holder to the mainboard by passing a pair of pins through the bores and the openings provided on the mainboard.

6. The holder as set forth in claim 1, wherein the holding member is formed at a bottom with a pair of rotary shafts and the base member is formed at a bottom with a pair of pivotal openings for receiving the rotary shafts such that the holding member is rotatable with respect to the base member.

7. The holder as set forth in claim 6, wherein the pivotal opening of the base member is formed with an inclined face at an upper end of the pivotal opening to allow easy insertion of the rotary shafts into the pivotal openings.

8. The holder as set forth in claim 1, wherein the base member is further formed with an indent at a bottom thereof for receiving a corresponding slot connector adapted to the CPU module.

9. The holder as set forth in claim 1, wherein the base member is formed with at least a recess having a top edge at an outer bottom of the base member and the holding member is formed with a finger at an outer bottom of the holding member to allow the finger such to clamp onto the top edge.

10. The holder as set forth in claim 9, wherein the top edge of the recess of the base member is further formed with an inclined face to allow easy clamping of the finger onto the top edge.

11. The holder as set forth in claim 1, wherein the holder includes a pair of latches.

12. A universal retaining mechanism (URM) comprising a pair of holders that are secured to a mainboard and for holding a CPU module in-between the holders, the CPU module including a front side, a rear side, and two opposing sides, and being formed with locking means and/or locking surfaces, wherein each holder comprises:
   a base member for securing the holder to the mainboard; and
   a holding member rotatably connected to the base member and having a main wall, wherein the holding member includes an inner side that contacts the CPU module to be inserted, and an outer side that does not contact the CPU module to be inserted; the holding member including:
   at least a latch integrally formed with the holding member and arranged on a side of the main wall for latching the locking surfaces of the CPU module from the front and rear sides of the CPU module;
   positioning means formed on the main wall for locking to the CPU module; and
   a flexible rib integrally formed with the holding member on the main wall and for cooperating with the latch to guide the CPU module upon insertion of the CPU module.

13. The universal retaining mechanism as set forth in claim 12, wherein the holding member is further formed with at least a side wall extending from a side of the main wall neighboring the latch, extending towards the inner side of the holding member in a direction that is substantially normal to the main wall, and being distant from the flexible rib to form a guide groove having a fixed gap.

14. The universal retaining mechanism as set forth in claim 12, wherein the flexible rib has a resilient pivot that is located at the outer side of the holding member.

15. The universal retaining mechanism as set forth in claim 12, wherein the positioning means is a square aperture.

16. The universal retaining mechanism as set forth in claim 12, wherein the base member of the holder is formed with a pair of penetrating bores that accommodate a pair of openings provided on the mainboard, so as to secure the holder to the mainboard by passing a pair of pins through the bores and the openings provided on the mainboard.

17. The universal retaining mechanism as set forth in claim 12, wherein the holding member is formed at a bottom with a pair of rotary shafts and the base member is formed at a bottom with a pair of pivotal openings for receiving the rotary shafts such that the holding member is rotatable with respect to the base member.

18. The universal retaining mechanism as set forth in claim 17, wherein the pivotal opening of the base member is formed with an inclined face at an upper end of the pivotal opening to allow easy insertion of the rotary shafts into the pivotal openings.

19. The universal retaining mechanism as set forth in claim 12, wherein the base member is further formed with an indent at a bottom thereof for receiving a corresponding slot connector adapted to the CPU module.

20. The universal retaining mechanism as set forth in claim 12, wherein the base member is formed with at least a recess having a top edge at an outer bottom of the base member and the holding member is formed with a finger at an outer bottom of the holding member to allow the finger such to clamp onto the top edge.

21. The universal retaining mechanism as set forth in claim 20, wherein the top edge of the recess of the base member is further formed with an inclined face to allow easy clamping of the finger onto the top edge.

22. The universal retaining mechanism as set forth in claim 12, wherein the holder includes a pair of latches.

* * * * *